(12) United States Patent
Dai

(10) Patent No.: US 11,869,901 B2
(45) Date of Patent: Jan. 9, 2024

(54) DISPLAY PANEL, ARRAY SUBSTRATE, AND MANUFACTURING METHOD THEREOF

(71) Applicant: Shenzhen China Star Optoelectronics Semiconductor Display Technology Co., Ltd., Guangdong (CN)

(72) Inventor: Xingqiang Dai, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 422 days.

(21) Appl. No.: 17/263,951

(22) PCT Filed: Jan. 26, 2021

(86) PCT No.: PCT/CN2021/073766
§ 371 (c)(1),
(2) Date: Jan. 28, 2021

(87) PCT Pub. No.: WO2022/141705
PCT Pub. Date: Jul. 7, 2022

(65) Prior Publication Data
US 2022/0399288 A1 Dec. 15, 2022

(30) Foreign Application Priority Data
Jan. 4, 2021 (CN) .......................... 202110003053.9

(51) Int. Cl.
*H01L 27/12* (2006.01)
(52) U.S. Cl.
CPC ................................ *H01L 27/1248* (2013.01)

(58) Field of Classification Search
CPC ............... H01L 23/564; H01L 27/1248; H01L 27/1292; H01L 27/1214; H01L 21/56; H01L 23/291; H01L 23/293; H01L 23/3171; G02F 1/1368
USPC .......................................................... 257/72
See application file for complete search history.

(56) References Cited

U.S. PATENT DOCUMENTS

| 2002/0003403 A1* | 1/2002 | Ghosh | H10K 50/844 |
| | | | 313/512 |
| 2019/0372053 A1 | 12/2019 | Li | |
| 2020/0295294 A1 | 9/2020 | Hwang | |

FOREIGN PATENT DOCUMENTS

| CN | 104681586 | | 6/2015 | |
| CN | 104979492 | | 10/2015 | |
| CN | 110699668 | | 1/2020 | |
| CN | 110699668 A | * | 1/2020 | ........... C23C 16/402 |
| CN | 111129349 | | 5/2020 | |
| CN | 111129349 A | * | 5/2020 | ......... H01L 27/3244 |
| CN | 111785684 | | 10/2020 | |
| CN | 112002794 | | 11/2020 | |

(Continued)

*Primary Examiner* — Changhyun Yi

(57) ABSTRACT

The present application discloses a display panel, an array substrate, and a manufacturing method thereof. The array substrate includes a substrate, a thin-film transistor layer, an insulating nanoparticle layer, and an organic polymer layer. The thin-film transistor layer is disposed on the substrate. The insulating nanoparticle layer is disposed on the substrate and covers the thin-film transistor layer. The organic polymer layer is stacked on a side of the insulating nanoparticle layer away from the thin-film transistor layer and covers the insulating nanoparticle layer.

19 Claims, 2 Drawing Sheets

(56) References Cited

FOREIGN PATENT DOCUMENTS

CN        112002794  A   *  11/2020   ............. B32B 27/06

* cited by examiner

DISPLAY PANEL, ARRAY SUBSTRATE, AND MANUFACTURING METHOD THEREOF

RELATED APPLICATIONS

This application is a National Phase of PCT Patent Application No. PCT/CN2021/073766 having International filing date of Jan. 26, 2021, which claims the benefit of priority Chinese Patent Application No. 202110003053.9 filed on Jan. 4, 2021. The contents of the above applications are all incorporated by reference as if fully set forth herein in their entirety.

FIELD AND BACKGROUND OF THE OF INVENTION

The present application is related to the field of display technology and, specifically, to a display panel, an array substrate, and a manufacturing method thereof.

Generally, electronic appliances (such as monitors, TVs, laptop computers, and digital cameras) include display panels for realizing images. For example, a display panel may include a liquid crystal display panel and/or an organic light-emitting display panel.

Generally, the display panel includes an array substrate and a color filter substrate corresponding to the array substrate. The array substrate includes a substrate and a thin-film transistor layer disposed on the substrate. The thin-film transistor layer includes a plurality of thin-film transistors. In order to enhance a device performance of the thin-film transistors, a packaging structure is provided outside the thin-film transistor layer, and the packaging structure is usually an inorganic layer (such as $SiO_2$) to provide simple protection to the thin film transistor. However, because the packaging structure is too simple, it will be easily damaged once it is subjected to mechanical impact or repeated erosion of water and oxygen, thereby damaging the thin-film transistors and affecting a yield of the array substrate.

SUMMARY OF THE INVENTION

A purpose of the present application is to provide a display panel, an array substrate, and a manufacturing method thereof, so as to solve a technical problem that a current thin-film transistor layer has poor ability to block water and oxygen.

In order to achieve the above purpose, the present application provides an array substrate including a substrate, a thin-film transistor layer disposed on the substrate, an insulating nanoparticle layer disposed on the substrate and covering the thin-film transistor layer, and an organic polymer layer stacked on a side of the insulating nanoparticle layer away from the thin-film transistor layer and covering the insulating nanoparticle layer.

Furthermore, a chemical bond is formed between the insulating nanoparticle layer and the organic polymer layer.

Furthermore, material of the organic polymer layer includes a polystyrene derivative. The polystyrene derivative includes a polystyrene main chain structure and a carboxyl structure connected to the polystyrene main chain structure. The insulating nanoparticle layer includes an oxide nanoparticle. A hydrogen bond is formed between the carboxyl structure and the oxide nanoparticle.

Furthermore, the array substrate further includes an inorganic layer disposed on a side of the thin-film transistor layer away from the insulating nanoparticle layer.

Furthermore, materials of the insulating nanoparticle layer and the inorganic layer are same.

Furthermore, the materials of the insulating nanoparticle layer and the inorganic layer are $SiO_2$. A $SiO_2$ nanoparticle in the insulating nanoparticle layer and a $SiO_2$ nanoparticle in the inorganic layer form a silicon-oxygen bond.

Furthermore, the materials of the insulating nanoparticle layer and the inorganic layer include silicon oxide or zeolite.

Furthermore, a size of a nanoparticle of the insulating nanoparticle layer ranges from 20 nm to 80 nm.

In order to achieve the above purpose, the present application further provides a manufacturing method of the array substrate including steps of: providing a substrate; forming a thin-film transistor layer on the substrate; providing a mixed solution including an insulating nanoparticle, organic polymer, and a solvent; coating the mixed solution on the substrate and the thin-film transistor layer to form an uncured mixed film layer; and performing an annealing heat treatment on the uncured mixed film layer to form a cured insulating nanoparticle layer and a cured organic polymer layer. The insulating nanoparticle layer is disposed on the substrate and covers the thin-film transistor layer. The organic polymer layer is stacked on a side of the insulating nanoparticle layer away from the thin-film transistor layer and covers the insulating nanoparticle layer.

Furthermore, the step of performing the annealing heat treatment on the uncured mixed film layer includes heating the uncured mixed film layer to a molten state and cooling the mixed film layer in the molten state to form layered phase separation protective layers. The layered phase separation protective layers include the insulating nanoparticle layer and the organic polymer layer.

Furthermore, material of the organic polymer layer includes a polystyrene derivative. The polystyrene derivative includes a polystyrene main chain structure and a carboxyl structure connected to the polystyrene main chain structure. The insulating nanoparticle layer includes an oxide nanoparticle. The step of cooling the mixed film layer in the molten state to form the layered phase separation protective layers includes forming a hydrogen bond between the carboxyl structure and the oxide nanoparticle.

Furthermore, in the step of providing the mixed solution, a volume ratio of the insulating nanoparticle to the organic polymer to the solvent is (0.9-1.1):(0.9-1.1):(0.7-1.2).

In order to achieve the above purpose, the present application further provides a display panel including the above-mentioned array substrate and a color filter substrate corresponding to the array substrate.

Furthermore, a chemical bond is formed between the insulating nanoparticle layer and the organic polymer layer.

Furthermore, material of the organic polymer layer includes a polystyrene derivative, the polystyrene derivative includes a polystyrene main chain structure and a carboxyl structure connected to the polystyrene main chain structure. The insulating nanoparticle layer includes an oxide nanoparticle. A hydrogen bond is formed between the carboxyl structure and the oxide nanoparticle.

Furthermore, the array substrate further includes an inorganic layer disposed on a side of the thin-film transistor layer away from the insulating nanoparticle layer.

Furthermore, materials of the insulating nanoparticle layer and the inorganic layer are same.

Furthermore, the materials of the insulating nanoparticle layer and the inorganic layer are $SiO_2$. A $SiO_2$ nanoparticle in the insulating nanoparticle layer and a $SiO_2$ nanoparticle in the inorganic layer form a silicon-oxygen bond.

Furthermore, the materials of the insulating nanoparticle layer and the inorganic layer include silicon oxide or zeolite.

Furthermore, a size of a nanoparticle of the insulating nanoparticle layer ranges from 20 nm to 80 nm.

Technical effects of the present application are to provide the display panel, the array substrate, and the manufacturing method thereof. The array substrate includes the substrate, the thin-film transistor layer, the insulating nanoparticle layer, and the organic polymer layer. The thin-film transistor layer is disposed on the substrate. The insulating nanoparticle layer is disposed on the substrate and covers the thin-film transistor layer. The organic polymer layer is stacked on the side of the insulating nanoparticle layer away from the thin-film transistor layer and covers the insulating nanoparticle layer. The present application forms the stacked insulating nanoparticle layer and organic polymer layer on the thin-film transistor layer, which is beneficial to increasing compactness of the entire array substrate, effectively blocking intrusion of water and oxygen from outside, and extending a lifespan of the display panel.

BRIEF DESCRIPTION OF THE SEVERAL VIEWS OF THE DRAWINGS

The following describes specific embodiments of the present application in detail with reference to the accompanying drawings, which will make technical solutions and other beneficial effects of the present application obvious.

Figure 1:
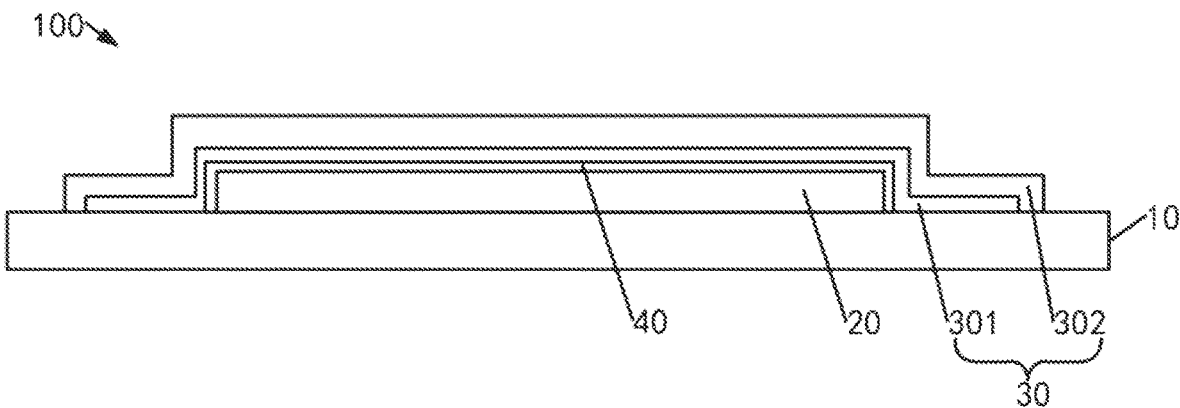
FIG. 1 is a structural schematic diagram of an array substrate provided by an embodiment of the present application.

REFERENCE SIGNS array substrate 100, substrate 10, thin-film transistor layer 20, layered phase separation protective layers 30, insulating nanoparticle layer 301, organic polymer layer 302, inorganic layer 40.

DESCRIPTION OF SPECIFIC EMBODIMENTS OF THE INVENTION

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application.

In the description of the present application, it should be explained that the terms "center", "portrait", "transverse", "length", "width", "thickness", "upper", "lower", "front", "back", "left", "right", "vertical", "horizontal", "top", "bottom", "inside", "outside", etc. are based on the drawings. The orientation or positional relationship is only for the convenience of describing the present application and simplifying the description, and does not indicate or imply that the device or element referred to must have a specific orientation, structure and operation in a specific orientation, and should not be viewed as limitations of the present application.

Please refer to FIG. 1. FIG. 1 is a structural schematic diagram of an array substrate provided by an embodiment of the present application.

This embodiment provides an array substrate 100, including a substrate 10, a thin-film transistor layer 20, an inorganic layer 40, and layered phase separation protective layers 30.

The substrate 10 can be a glass substrate, a polyimide (PI) substrate, or a ceramic substrate, etc.

The thin-film transistor layer 20 is disposed on the substrate 10. The thin-film transistor layer 20 includes an active layer, a gate insulating layer, a gate layer, a passivation layer, and a source/drain layer. The gate layer is disposed on the substrate. The gate insulating layer is disposed on the gate layer and the substrate and covers the gate layer. The active layer is disposed on the gate insulating layer and faces the gate layer. The passivation layer is disposed on the active layer and the gate insulating layer and covers the gate insulating layer. The source/drain layer penetrates the passivation layer and the gate insulating layer and is connected to an upper surface of the active layer.

The inorganic layer 40 is disposed on the thin-film transistor layer 20 and covers the thin-film transistor layer 20. Specifically, the inorganic layer 40 is disposed on the source/drain layer and the passivation layer to protect the thin-film transistor and prevent the thin-film transistor from being intruded by water and oxygen. It can be configured as a second passivation layer and a planarization layer to protect the thin-film transistor layer 20, as long as this film layer is made of inorganic materials, which is not particularly limited herein.

The layered phase separation protective layers 30 are disposed on the thin-film transistor layer 20. The layered phase separation protective layers 30 includes an insulating nanoparticle layer 301 and an organic polymer layer 302, which are stacked.

Specifically, the insulating nanoparticle layer 301 is disposed on the substrate 10 and covers the thin-film transistor layer 20. In other words, the insulating nanoparticle layer 301 is closely attached to and wraps the inorganic layer 40 disposed on an outer side of the thin-film transistor layer 20, so that the inorganic layer 40 and the insulating nanoparticle layer 301 are closely attached to each other.

In this embodiment, materials of the insulating nanoparticle layer 301 and the inorganic layer 40 are same. The materials of the insulating nanoparticle layer 301 and the inorganic layer 40 are silicon oxide (e.g., $SiO_2$) or zeolite. A size of a nanoparticle of the insulating nanoparticle layer 301 ranges from 20 nm to 80 nm.

When the materials of the insulating nanoparticle layer 301 and the inorganic layer 40 are $SiO_2$, a $SiO_2$ nanoparticle in the insulating nanoparticle layer 301 and a $SiO_2$ nanoparticle in the inorganic layer 40 form a silicon-oxygen bond, which is beneficial to increasing compactness between film layers.

Alternatively, in another embodiment, when the materials of the insulating nanoparticle layer 301 and the inorganic layer 40 are other kinds of raw materials, other kinds of chemical bonds can be formed between the insulating nanoparticle layer 301 and the inorganic layer 40 to increase the compactness between the film layers.

The organic polymer layer 302 is stacked on a side of the insulating nanoparticle layer 301 away from the thin-film transistor layer 20 and covers the insulating nanoparticle layer 301. A chemical bond is formed between the insulating nanoparticle layer 301 and the organic polymer layer 302, which can increase the compactness between the insulating nanoparticle layer 301 and the organic polymer layer 302, thereby enhancing a water and oxygen barrier performance of the array substrate 100.

In this embodiment, material of the organic polymer layer 302 includes a polystyrene derivative. The polystyrene derivative includes a polystyrene main chain structure and a carboxyl structure connected to the polystyrene main chain structure. The insulating nanoparticle layer includes an oxide nanoparticle (such as oxygen-containing compounds such as $SiO_2$). As a result, a hydrogen bond can be formed between the carboxyl structure and the oxide nanoparticle.

Optionally, molecular mass of the polystyrene derivative is controlled at above 10000, and at least one end of the polystyrene derivative is connected with the carboxyl structure, which can be configured to enhance an interaction strength between the insulating nanoparticle layer 301 and the organic polymer layer 302.

Alternatively, in another embodiment, the organic polymer layer 302 can be other kinds of polymers, and the insulating nanoparticle layer 301 can be other kinds of compounds, as long as the chemical bond can be formed between the organic polymer layer 302 and the insulating nanoparticle layer 301, the present application does not specifically limit the kinds of chemical bonds.

It should be emphasized that the layered phase separation protective layers 30 are a compact bifunctional layered phase obtained by a phase separation method under a thermodynamic control, which are the stacked insulating nanoparticle layer 301 and organic polymer layer 302. Because the phase separation is a result of the thermodynamic control, a more stable packaging structure can be formed outside the thin-film transistor layer 20 through auxiliary chemical modification means. Because a structure of the layered phase separation protective layers 30 is finally in a thermodynamically stable state, the thin-film transistor layer 20 is very stable and is not easily damaged. This ensures a stability of thin-film transistor devices and enhances the water and oxygen barrier performance of the array substrate 100.

The array substrate 100 provided by this embodiment includes the thin-film transistor layer 20 and the layered phase separation protective layers 30. The layered phase separation protective layers 30 include the insulating nanoparticle layer 301 and the organic polymer layer 302. The insulating nanoparticle layer 301 and the inorganic layer 40 on the outer side of the thin-film transistor layer 20 form the silicon-oxygen bond, so that the insulating nanoparticle layer 301 and the inorganic layer 40 are closely attached to each other. The insulating nanoparticle layer 301 also forms the hydrogen bond with the organic polymer layer 302, so that the insulating nanoparticle layer 301 and the organic polymer layer 302 are closely attached to each other. Therefore, the thin-film transistor layer 20 and the layered phase separation protective layers 30 are in close contact with each other, which is beneficial to increasing the compactness of the entire packaging structure of the array substrate 100 and effectively block intrusion of water and oxygen from outside.

Figure 2:
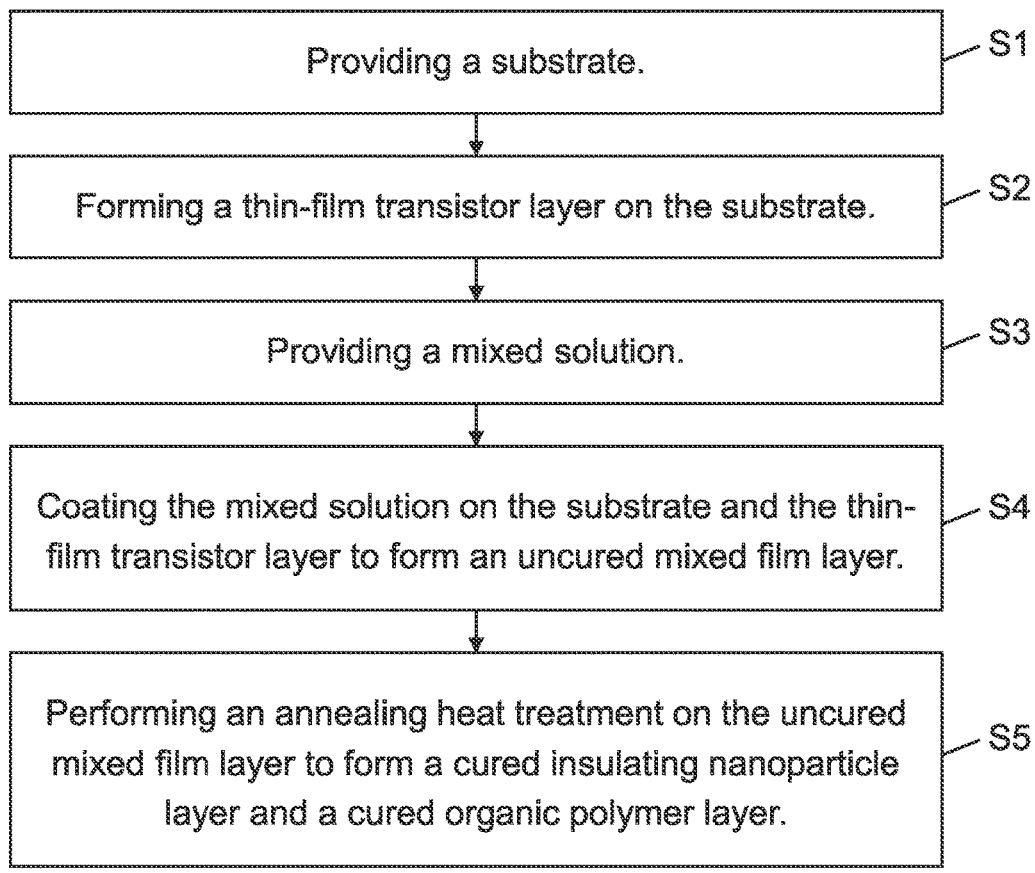
FIG. 2 is a flowchart of a manufacturing method of the array substrate provided by an embodiment of the present application.

Please refer to FIG. 2. FIG. 2 is a flowchart of a manufacturing method of the array substrate provided by an embodiment of the present application.

The manufacturing method of the array substrate includes step S1) to S5) as follows.

S1) providing the substrate.

As shown in FIG. 1, the substrate 10 can be a glass substrate, a polyimide (PI) substrate, or a ceramic substrate, etc.

S2) forming the thin-film transistor layer on the substrate.

Specifically, as shown in FIG. 1, the thin-film transistor layer 20 includes an active layer, the gate insulating layer, the gate layer, the passivation layer, and the source/drain layer. The gate layer is disposed on the substrate. The gate insulating layer is disposed on the gate layer and the substrate and covers the gate layer. The active layer is disposed on the gate insulating layer and faces the gate layer. The passivation layer is disposed on the active layer and the gate insulating layer and covers the gate insulating layer. The source/drain layer penetrates the passivation layer and the gate insulating layer and is connected to an upper surface of the active layer.

The inorganic layer 40 is disposed on the thin-film transistor layer 20 and covers the thin-film transistor layer 20. Specifically, the inorganic layer 40 is disposed on the source/drain layer and the passivation layer to protect the thin-film transistor and prevent the thin-film transistor from being intruded by water and oxygen. It can be configured as the second passivation layer and the planarization layer to protect the thin-film transistor layer 20, as long as this film layer is made of inorganic materials, which is not particularly limited herein.

S3) providing a mixed solution including an insulating nanoparticle, organic polymer, and a solvent.

Specifically, a volume ratio of the insulating nanoparticle to the organic polymer to the solvent is (0.9-1.1):(0.9-1.1):(0.7-1.2). Preferably, the volume ratio of the insulating nanoparticle to the organic polymer to the solvent is 1:1:1. The insulating nanoparticle layer includes oxide nanoparticles such as silicon oxide (e.g., $SiO_2$) or zeolite. The size of the nanoparticle of the insulating nanoparticle layer 301 ranges from 20 nm to 80 nm. The organic polymer is a polystyrene derivative, and the solvent includes n-hexane and/or methylene chloride.

S4) coating the mixed solution on the substrate and the thin-film transistor layer to form an uncured mixed film layer.

S5) performing an annealing heat treatment on the uncured mixed film layer to form a cured insulating nanoparticle layer and a cured organic polymer layer. The insulating nanoparticle layer is disposed on the substrate and covers the thin-film transistor layer. The organic polymer layer is stacked on the side of the insulating nanoparticle layer away from the thin-film transistor layer and covers the insulating nanoparticle layer.

Specifically, the material of the organic polymer layer includes the polystyrene derivative. The polystyrene derivative includes the polystyrene main chain structure and the carboxyl structure connected to the polystyrene main chain structure. The insulating nanoparticle layer includes the oxide nanoparticle. The uncured mixed film layer is heated to the molten state, and the mixed film layer in the molten state is cooled to form layered phase separation protective layers, so as to form the hydrogen bond between the carboxyl structure and the oxide nanoparticle.

During the annealing heat treatment, the polystyrene derivative includes the polystyrene main chain structure and the carboxyl structure connected to the polystyrene main chain structure (e.g., an end of the polystyrene main chain structure). When the polystyrene derivative is heated to 98°

C. to 110° C., the hydrogen bond is formed between the carboxyl structure and the insulating nanoparticle layer. When a temperature of the annealing heat treatment is greater than or equal to 180° C., the solvent volatilizes, and the layered phase separation protective layers form a two-layer stacked insulating nanoparticle layer and organic polymer layer.

It should be explained that the above-mentioned "annealing heat treatment" is to motivate each component in a disordered uncured mixed film layer (including the insulating nanoparticle and the organic polymer). That is, $SiO_2$ particles in the insulating nanoparticle layer and polymer chains of the polystyrene derivative in the organic polymer layer are active for recombination. The $SiO_2$ particles in the component may be inactive, but the polymer chains of the polystyrene derivative can be activated to further induce a formation of a layered phase. In order to activate the polymer chains of the polystyrene derivative, it only needs to be heated to a temperature above a melting temperature.

In this embodiment, the melting temperature of the polystyrene derivative is 100° C. Therefore, when the melting temperature of the polystyrene derivative is 100° C. or higher, the polymer chains of the polystyrene derivative can be recombined. The molecular mass of the polystyrene derivative is controlled at above 10000, and the end of the polystyrene derivative is connected with a carboxyl group, which can be configured to enhance the interaction strength between the insulating nanoparticle and the polystyrene derivative.

Figure 3:
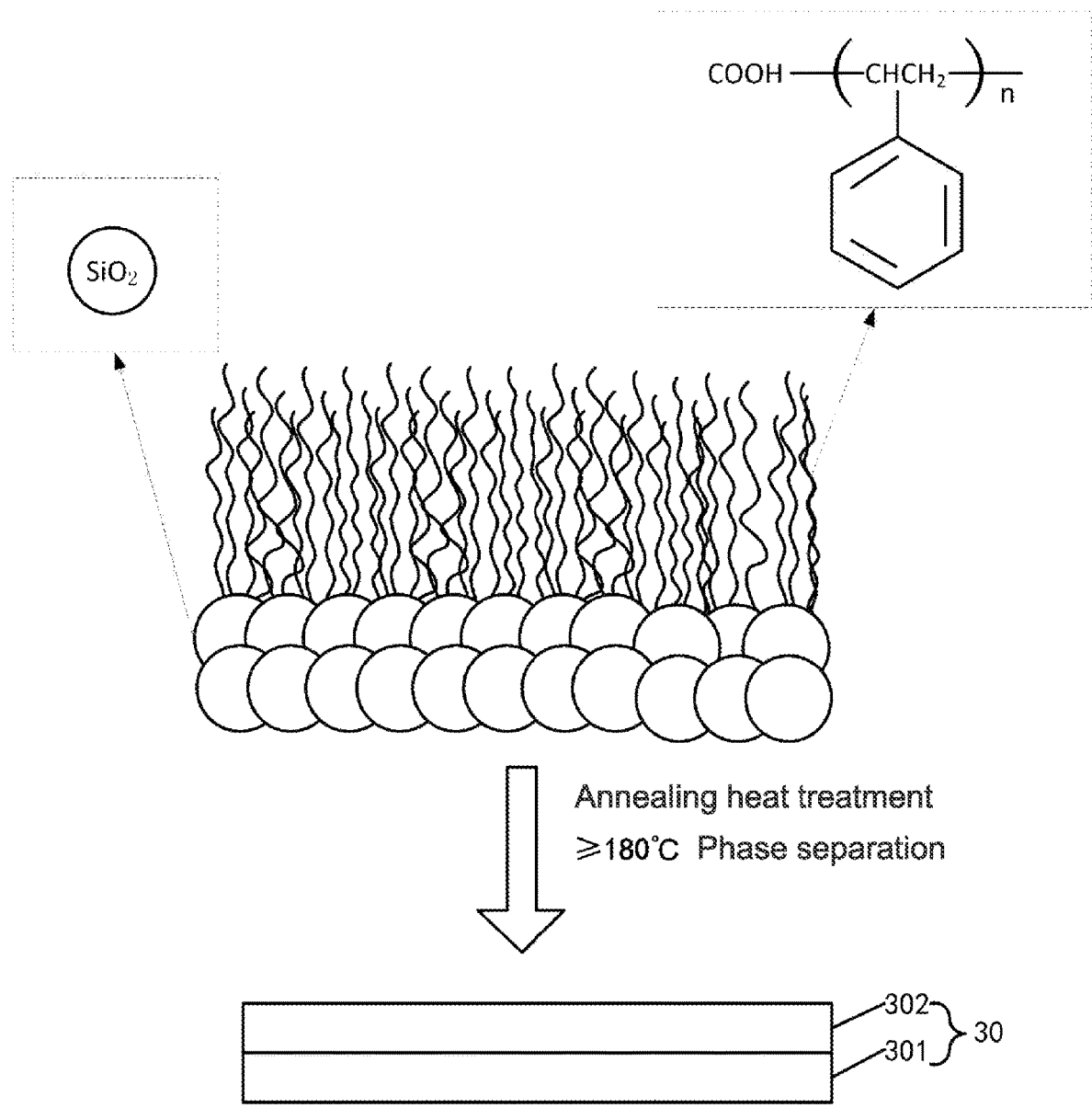
FIG. 3 is a structural schematic diagram of layered phase separation protective layers provided by an embodiment of the present application.

Please refer to FIG. 3. FIG. 3 is a structural schematic diagram of layered phase separation protective layers provided by an embodiment of the present application.

After the annealing heat treatment, with reference to FIG. 1, the polystyrene derivative forms a compact organic polymer layer 302, and the organic polymer layer 302 forms a very good hydrophobic protective layer, which has a good water and oxygen barrier effect. Because the carboxyl group (—COOH) at the end of the polystyrene derivative forms a hydrogen bond with oxygen in the oxide nanoparticle (e.g., $SiO_2$) in the insulating nanoparticle layer 301, a bonding strength between the organic polymer layer 302 and the insulating nanoparticle layer 301 is increased. The insulating nanoparticle layer 301 itself is formed with abundant silicon-oxygen bonds (Si—O), which are closely arranged with each other, are closely arranged into a regular layer after the annealing heat treatment, and are in close contact with the inorganic layer 40 of an outermost layer of the thin-film transistor layer 20. The formed silicon-oxygen bonds (Si—O) are further closely attached to the inorganic layer 40 of the outermost layer of the thin-film transistor layer 20, so that layers of the packaging structure of the thin-film transistor layer 20 are closely connected and has good compactness, thereby enhancing the water and oxygen barrier performance of the array substrate 100.

Specifically, as shown in FIG. 1, the insulating nanoparticle layer 301 is disposed on the substrate 10 and covers the thin-film transistor layer 20. In other words, the insulating nanoparticle layer 301 is closely attached to and wraps the inorganic layer 40 of the outermost layer of the thin-film transistor layer 20, so that the inorganic layer 40 is closely attached to the insulating nanoparticle layer 301.

In this embodiment, materials of the insulating nanoparticle layer 301 and the inorganic layer 40 are same. The materials of the insulating nanoparticle layer 301 and the inorganic layer 40 are silicon oxide (e.g., $SiO_2$) or zeolite. When the materials of the insulating nanoparticle layer 301 and the inorganic layer 40 are $SiO_2$, a $SiO_2$ nanoparticle in the insulating nanoparticle layer 301 and a $SiO_2$ nanoparticle in the inorganic layer 40 form a silicon-oxygen bond, which is beneficial to increasing compactness between film layers.

In this embodiment, the material of the organic polymer layer 302 is the polystyrene derivative. When the polystyrene derivative reaches the melting temperature, the polymer chains of the polystyrene derivative are induced to form the layered phase. The oxide nanoparticle (e.g., $SiO_2$) in the insulating nanoparticle layer 301 form the hydrogen bond with the carboxyl group in the polystyrene derivative, so that the insulating nanoparticle layer and the organic polymer layer are closely attached to each other. The molecular mass of the polystyrene derivative is controlled at above 10000, and at least one end of the polystyrene derivative is connected with the carboxyl structure, which can be configured to enhance the interaction strength between the insulating nanoparticle layer 301 and the organic polymer layer 302.

It should be emphasized that the layered phase separation protective layers 30 are the compact bifunctional layered phase obtained by the phase separation method under the thermodynamic control, which are the stacked insulating nanoparticle layer 301 and organic polymer layer 302. Because the phase separation is the result of the thermodynamic control, the thin-film transistor layer 20 can have a more stable structure through auxiliary chemical modification means. Because the structure of the layered phase separation protective layers 30 is finally in the thermodynamically stable state, the thin-film transistor layer 20 is very stable and is not easily damaged. This ensures the stability of the thin-film transistor devices and enhances the water and oxygen barrier performance of the array substrate 100.

In general, in a process of manufacturing the layered phase separation protective layers 30, the oxide nanoparticle (e.g., $SiO_2$) is introduced. In one aspect, a technical problem of the inorganic layer 40 (e.g., $SiO_2$) on the outer side of the thin-film transistor layer 20 causing a poor ability of the devices to block water and oxygen can be further compensated. When the oxide nanoparticle and the organic polymer are mixed and undergo the annealing heat treatment to form the layered phase separation protective layers 30, the bonding strength between the oxide nanoparticle and the organic polymer is increased, and the compactness between the film layers is improved. In another aspect, the insulating nanoparticle layer 301 itself is formed with the abundant silicon-oxygen bonds (Si—O), which are closely arranged with each other, are closely arranged into a regular layer after the annealing heat treatment, and are in close contact with the inorganic layer 40 on the outer side of the thin-film transistor layer 20. The formed silicon-oxygen bonds (Si—O) are further closely attached to the thin-film transistor layer 20, so that the thin-film transistor layer 20 and the layered phase separation protective layers 30 are in close contact with each other, which is beneficial to increasing the compactness of the entire packaging structure of the array substrate 100 and effectively block intrusion of water and oxygen from outside.

Figure 4:
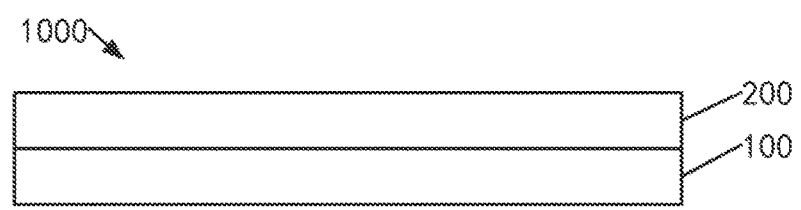
FIG. 4 is a structural schematic diagram of a display panel provided by an embodiment of the present application.

Please refer to FIG. 4. FIG. 4 is a structural schematic diagram of a display panel provided by an embodiment of the present application.

The display panel 1000 provided by this embodiment includes the above-mentioned array substrate 100 and a color filter substrate 200. The array substrate 100 corresponds to the color filter substrate 200.

Technical effects of the present application are to provide the display panel, the array substrate, and the manufacturing method thereof. The array substrate includes the substrate, the thin-film transistor layer, the insulating nanoparticle layer, and the organic polymer layer. The thin-film transistor layer is disposed on the substrate. The insulating nanoparticle layer is disposed on the substrate and covers the thin-film transistor layer. The organic polymer layer is stacked on the side of the insulating nanoparticle layer away from the thin-film transistor layer and covers the insulating nanoparticle layer. the present application forms the stacked insulating nanoparticle layer and organic polymer layer on the thin-film transistor layer, which is beneficial to increasing compactness of the entire array substrate, effectively blocking intrusion of water and oxygen from outside, and extending a lifespan of the display panel.

The display panel, the array substrate, and the manufacturing method thereof provided by embodiments of the present application are described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. An array substrate, comprising:
   a substrate;
   a thin-film transistor layer disposed on the substrate;
   an insulating nanoparticle layer comprising an insulating nanoparticle disposed on the substrate and covering the thin-film transistor layer; and
   an organic polymer layer comprising an organic polymer stacked on a side of the insulating nanoparticle layer away from the thin-film transistor layer and covering the insulating nanoparticle layer;
   wherein a volume ratio of the insulating nanoparticle and the organic polymer is (0.9-1.1):(0.9-1.1).

2. The array substrate according to claim 1, wherein a chemical bond is formed between the insulating nanoparticle layer and the organic polymer layer.

3. The array substrate according to claim 2, wherein material of the organic polymer layer comprises a polystyrene derivative, the polystyrene derivative comprises a polystyrene main chain structure and a carboxyl structure connected to the polystyrene main chain structure, the insulating nanoparticle layer comprises an oxide nanoparticle, and a hydrogen bond is formed between the carboxyl structure and the oxide nanoparticle.

4. The array substrate according to claim 1, further comprising:
   an inorganic layer disposed on a side of the thin-film transistor layer away from the insulating nanoparticle layer.

5. The array substrate according to claim 4, wherein materials of the insulating nanoparticle layer and the inorganic layer are same.

6. The array substrate according to claim 5, wherein the materials of the insulating nanoparticle layer and the inorganic layer are $SiO_2$, and a $SiO_2$ nanoparticle in the insulating nanoparticle layer and a $SiO_2$ nanoparticle in the inorganic layer form a silicon-oxygen bond.

7. The array substrate according to claim 5, wherein the materials of the insulating nanoparticle layer and the inorganic layer comprise silicon oxide or zeolite.

8. The array substrate according to claim 5, wherein a size of a nanoparticle of the insulating nanoparticle layer ranges from 20 nm to 80 nm.

9. A display panel, comprising:
   the array substrate according to claim 1; and
   a color filter substrate corresponding to the array substrate.

10. The display panel according to claim 9, wherein a chemical bond is formed between the insulating nanoparticle layer and the organic polymer layer.

11. The display panel according to claim 10, wherein material of the organic polymer layer comprises a polystyrene derivative, the polystyrene derivative comprises a polystyrene main chain structure and a carboxyl structure connected to the polystyrene main chain structure, the insulating nanoparticle layer comprises an oxide nanoparticle, and a hydrogen bond is formed between the carboxyl structure and the oxide nanoparticle.

12. The display panel according to claim 9, wherein the array substrate further comprises:
   an inorganic layer disposed on a side of the thin-film transistor layer away from the insulating nanoparticle layer.

13. The display panel according to claim 12, wherein materials of the insulating nanoparticle layer and the inorganic layer are same.

14. The display panel according to claim 13, wherein the materials of the insulating nanoparticle layer and the inorganic layer are $SiO_2$, and a $SiO_2$ nanoparticle in the insulating nanoparticle layer and a $SiO_2$ nanoparticle in the inorganic layer form a silicon-oxygen bond.

15. The display panel according to claim 14, wherein the materials of the insulating nanoparticle layer and the inorganic layer comprise silicon oxide or zeolite.

16. The display panel according to claim 13, wherein a size of a nanoparticle of the insulating nanoparticle layer ranges from 20 nm to 80 nm.

17. A manufacturing method of an array substrate, comprising steps of:
   providing a substrate;
   forming a thin-film transistor layer on the substrate;
   providing a mixed solution comprising an insulating nanoparticle, organic polymer, and a solvent in a volume ratio of (0.9-1.1):(0.9-1.1):(0.7-1.2);
   coating the mixed solution on the substrate and the thin-film transistor layer to form an uncured mixed film layer; and
   performing an annealing heat treatment on the uncured mixed film layer to form a cured insulating nanoparticle layer and a cured organic polymer layer, wherein the insulating nanoparticle layer is disposed on the substrate and covers the thin-film transistor layer, and the organic polymer layer is stacked on a side of the insulating nanoparticle layer away from the thin-film transistor layer and covers the insulating nanoparticle layer.

18. The manufacturing method of the array substrate according to claim 17, wherein the step of performing the annealing heat treatment on the uncured mixed film layer comprises heating the uncured mixed film layer to a molten state and cooling the mixed film layer in the molten state to form layered phase separation protective layers, and the layered phase separation protective layers comprise the insulating nanoparticle layer and the organic polymer layer.

19. The manufacturing method of the array substrate according to claim 18, wherein material of the organic polymer layer comprises a polystyrene derivative, the polystyrene derivative comprises a polystyrene main chain structure and a carboxyl structure connected to the polystyrene main chain structure, and the insulating nanoparticle layer comprises an oxide nanoparticle; and the step of cooling the mixed film layer in the molten state to form the layered phase separation protective layers comprises forming a hydrogen bond between the carboxyl structure and the oxide nanoparticle.

* * * * *